US012733122B2

(12) United States Patent
Wingfield et al.

(10) Patent No.: US 12,733,122 B2
(45) Date of Patent: Sep. 8, 2026

(54) CHASSIS INCLUDING A REMOVABLE COUPLING MECHANISM FOR COMPUTING DEVICE ENGAGEMENT

(71) Applicant: Dell Products L.P., Round Rock, TX (US)

(72) Inventors: Megan Cherie Wingfield, Dalzell, SC (US); Eduardo Escamilla, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 90 days.

(21) Appl. No.: 18/956,175

(22) Filed: Nov. 22, 2024

(65) Prior Publication Data

US 2026/0150218 A1 May 28, 2026

(51) Int. Cl.
*H05K 7/14* (2006.01)

(52) U.S. Cl.
CPC .................................. *H05K 7/1489* (2013.01)

(58) Field of Classification Search
CPC ........................... H05K 7/1488; H05K 7/1489
See application file for complete search history.

(56) References Cited

U.S. PATENT DOCUMENTS

| | | | | |
|---|---|---|---|---|
| 10,317,949 | B1 * | 6/2019 | Lin | H05K 5/023 |
| 10,863,644 | B1 * | 12/2020 | Tseng | H05K 7/1487 |
| 11,570,927 | B1 * | 1/2023 | Chen | H05K 5/023 |
| 11,871,533 | B2 * | 1/2024 | Liu | H05K 7/1489 |
| 12,200,892 | B2 * | 1/2025 | Li | H05K 7/1487 |
| 12,366,902 | B2 * | 7/2025 | Mao | H05K 7/1487 |
| 12,557,236 | B2 * | 2/2026 | Chien | H05K 7/1487 |
| 2009/0080165 | A1 * | 3/2009 | Barina | H05K 7/1411 361/728 |
| 2021/0251098 | A1 * | 8/2021 | Gao | H05K 7/1417 |
| 2023/0337387 | A1 * | 10/2023 | Wang | H05K 5/0221 |
| 2023/0422422 | A1 * | 12/2023 | Huang | H05K 7/1487 |

* cited by examiner

*Primary Examiner* — Sagar Shrestha
(74) *Attorney, Agent, or Firm* — McDermott Will & Schulte LLP

(57) ABSTRACT

A chassis, including a manifold; computing devices; a coupling system, including: a first coupling apparatus positioned at the first side of the chassis, including: a first movement conversion plate including first conversion plate pins and a first conversion plate guide path; a first bar plate including first bar plate guide paths, wherein the first conversion plate pins are positioned within respective first bar plate guide paths; and a coupling bar coupled to the first bar plate and in contact with the one or more computing devices; a lever assembly including: a first lever arm positioned at the first side of the chassis, including a first lever arm guide path, and a first lever arm guide pin positioned within the first conversion plate guide path; and a lever bar coupled to the first lever arm.

18 Claims, 14 Drawing Sheets

CHASSIS INCLUDING A REMOVABLE COUPLING MECHANISM FOR COMPUTING DEVICE ENGAGEMENT

BACKGROUND

Field of the Disclosure

The disclosure relates generally to a chassis, and in particular, a chassis including a removable coupling mechanism for computing device engagement.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server chassis, often referred to as server cases or enclosures, house and protect the server's critical components, including the motherboard, processors, memory, and storage devices. The durability and accessibility of these enclosures are crucial for maintaining server integrity, allowing for easy upgrades, maintenance, and repairs.

SUMMARY

Innovative aspects of the subject matter described in this specification may be embodied in a chassis, including: a manifold; one or more computing devices positioned between a first side and a second side of the chassis, the second side opposite to the first side; a coupling system, including: a first coupling apparatus positioned at the first side of the chassis, including: a first movement conversion plate including first conversion plate pins and a first conversion plate guide path; a first bar plate including first bar plate guide paths, wherein the first conversion plate pins are positioned within respective first bar plate guide paths; and a coupling bar coupled to the first bar plate and in contact with the one or more computing devices; a lever assembly including: a first lever arm positioned at the first side of the chassis, including a first lever arm guide path, and a first lever arm guide pin positioned within the first conversion plate guide path; and a lever bar coupled to the first lever arm, wherein when the coupling system is in a first state: the lever assembly is in a first position to define a first position of the first bar plate such that the one or more computing devices are in a first position and uncoupled from the manifold, wherein the first conversion plate pins are positioned at a first end of respective first bar plate guide paths and the first lever arm guide pin is positioned at a first end of the first conversion plate guide path, wherein when the coupling system is in a second state: the lever assembly is in a second position to define a second position of the second bar plate such that the one or more computing devices are in a second position and coupled with the manifold, wherein the first conversion plate pins are positioned at a second end of respective first bar plate guide paths opposite to the first end and the first lever arm guide pin is positioned at a second end of the first conversion plate guide path opposite to the first end.

Other embodiments of these aspects include corresponding systems and apparatus.

These and other embodiments may each optionally include one or more of the following features. For instance, the coupling system is removable coupled to the chassis. The first movement conversion plate further includes a plurality of first movement conversion plate slots, wherein the chassis includes a plurality of chassis pins positioned at the first side, wherein a subset of the plurality of chassis pins are positioned within respective first movement conversion plate slots. The first lever arm further including a first lever arm slot, wherein the chassis includes a plurality of chassis pins positioned at the first side, wherein a first chassis pin of the plurality of chassis pins are positioned within the first lever arm slot. The first movement conversion plate further including a first hooking element, wherein when the coupling system is in the second state, the first hooking member is in superimposition with the first lever arm slot. The chassis includes a plurality of chassis pins positioned at the first side, wherein when the coupling system is in the second state, a second chassis pin of the plurality of chassis pins is positioned at a first end of the first lever arm guide path. The first lever arm guide pin is further positioned within a particular first bar plate guide path of the first bar plate guide paths. The particular first bar plate guide path extends in a first direction, wherein the first conversion plate pins are positioned within respective first bar plate guide paths that extend in a second direction orthogonal to the first direction. The computing devices are graphical processing units (GPUs). The coupling bar contacts the one or more computing devices at a first end of the computing devices opposite to a second end of the computing devices that are coupled to the manifold when the coupling system is in the second state. The coupling system further including: a second coupling apparatus positioned at the second side of the chassis, including: a second movement conversion plate including second conversion plate pins and a second conversion plate guide path; and a second bar plate including second bar plate guide paths, wherein the second conversion plate pins are positioned within respective second bar plate guide paths, wherein the coupling bar is coupled to the second bar plate. The lever assembly further including: a second lever arm positioned at the second side of the chassis, including a second lever arm guide path, and a second lever arm guide pin positioned within the second conversion plate guide path, wherein the lever bar is coupled to the second lever arm. When the coupling system is in the first state: the lever assembly is in the first position to define the first position of the first bar plate such that the one or more computing devices are in the first position and uncoupled from the manifold, wherein the second conversion plate pins are positioned at a first end of respective second bar plate guide paths and the second lever arm guide pin is positioned at a first end of the second conversion plate guide path. When the coupling system is in the second state: the lever assembly is in the second position to define the second position of the second bar plate such that the one or more computing devices are in the second position and coupled with the manifold, wherein the second conversion plate pins are positioned at a second end of respective second bar plate guide paths opposite to the first end and the second lever arm guide pin is positioned at a second end of the second conversion plate guide path opposite to the first end.

Particular implementations of the subject matter described in this specification can be implemented so as to realize one or more of the following advantages. For example, engaging the entire bank of GPUs requires the same amount of force as engaging a single GPU without a lever. The coupling system is removable from the chassis, making it more convenient during servicing. Additionally, the coupling system occupies much less space than individual levers. Further, the coupling system engages all GPUs without attaching to them, allowing for the removal of individual GPUs without needing to take out the entire bank.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
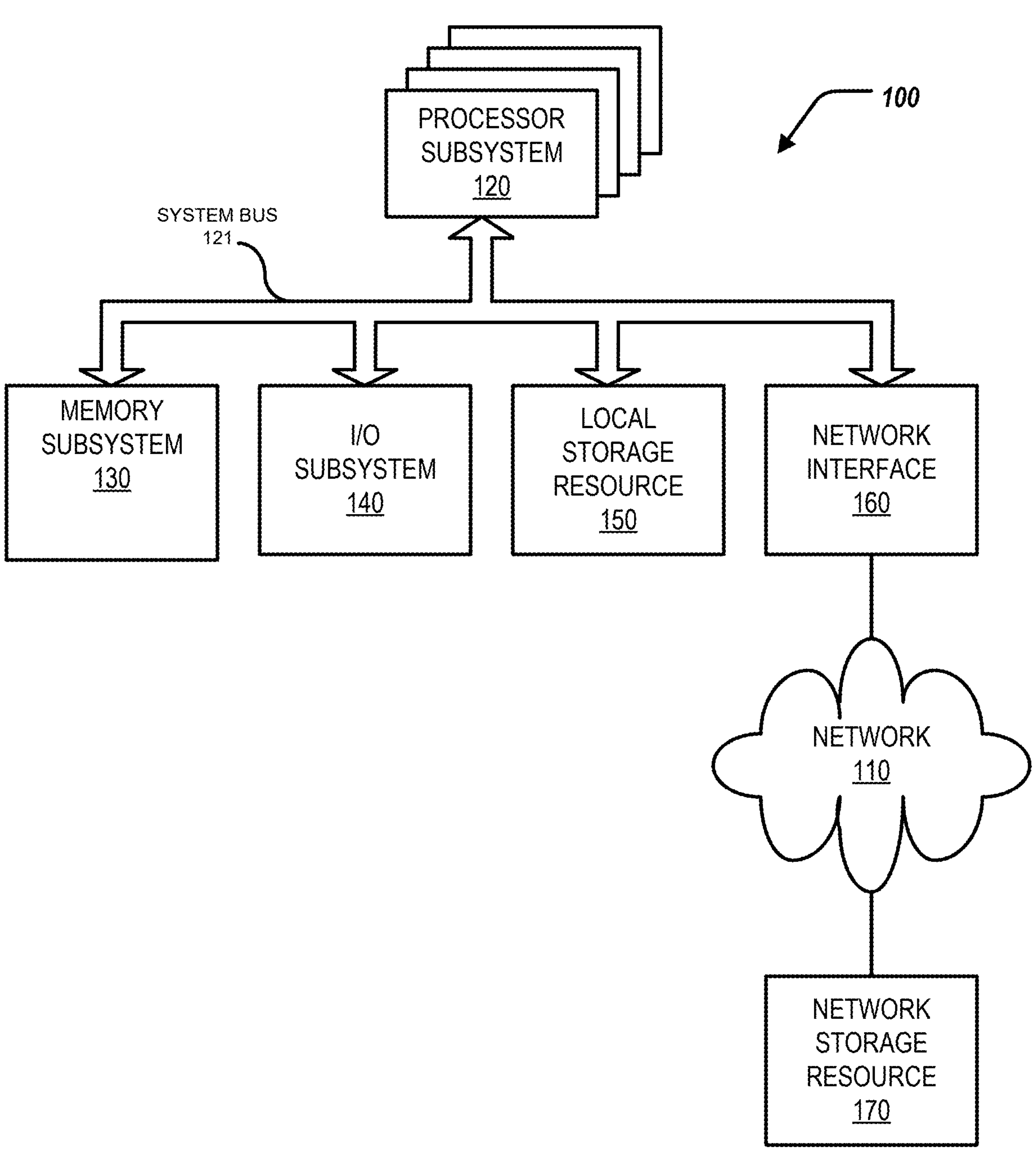
FIG. 1 is a block diagram of selected elements of an embodiment of an information handling system.

This disclosure discusses a chassis, and in particular, a chassis including a removable coupling mechanism for computing device engagement. In short, the coupling system can be removable and can be implemented such that once the computing devices are properly positioned, the coupling system can engage the computing devices to secure the computing devices within the chassis. The coupling system is removable, and can be detached from the chassis when needed. This feature is particularly useful during maintenance or upgrades, as it allows technicians to easily access the computing devices without any obstructions. Once the computing devices are correctly positioned within the chassis, the coupling system can be engaged. This engagement process involves the coupling system securing the computing devices in place, ensuring they are firmly held within the chassis. This secure positioning is crucial for the stability and proper functioning of the computing devices, as it prevents any movement or dislodging that could occur during operation. The design of the coupling system allows it to be implemented in a way that it can be easily engaged and disengaged. This flexibility makes it an efficient solution for securing computing devices, as it combines ease of use with reliable performance. The detailed mechanisms and methods of how the coupling system achieves this secure engagement are described further in the document Specifically, this disclosure discusses a chassis, including: a manifold; one or more computing devices positioned between a first side and a second side of the chassis, the second side opposite to the first side; a coupling system, including: a first coupling apparatus positioned at the first side of the chassis, including: a first movement conversion plate including first conversion plate pins and a first conversion plate guide path; a first bar plate including first bar plate guide paths, wherein the first conversion plate pins are positioned within respective first bar plate guide paths; and a coupling bar coupled to the first bar plate and in contact with the one or more computing devices; a lever assembly including: a first lever arm positioned at the first side of the chassis, including a first lever arm guide path, and a first lever arm guide pin positioned within the first conversion plate guide path; and a lever bar coupled to the first lever arm, wherein when the coupling system is in a first state: the lever assembly is in a first position to define a first position of the first bar plate such that the one or more computing devices are in a first position and uncoupled from the manifold, wherein the first conversion plate pins are positioned at a first end of respective first bar plate guide paths and the first lever arm guide pin is positioned at a first end of the first conversion plate guide path, wherein when the coupling system is in a second state: the lever assembly is in a second position to define a second position of the second bar plate such that the one or more computing devices are in a second position and coupled with the manifold, wherein the first conversion plate pins are positioned at a second end of respective first bar plate guide paths opposite to the first end and the first lever arm guide pin is positioned at a second end of the first conversion plate guide path opposite to the first end.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU)

or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such as wires, optical fibers, microwaves, radio waves, and other electromagnetic and/or optical carriers; and/or any combination of the foregoing.

Particular embodiments are best understood by reference to FIGS. 1-12 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include one or more processing resources such as a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of the information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, a camera, or another type of peripheral device.

Local storage resource 150 may comprise computer-readable media (e.g., hard disk drive, floppy disk drive, CD-ROM, and/or other types of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other types of rotating storage media, flash memory, EEPROM, and/or other types of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g., corporate) network. The network may be implemented as, or may be a part of, a storage area network (SAN), a personal area network (PAN), a local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g., customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet, or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
FIG. 2 illustrates a block diagram of a chassis.
Figure 2:
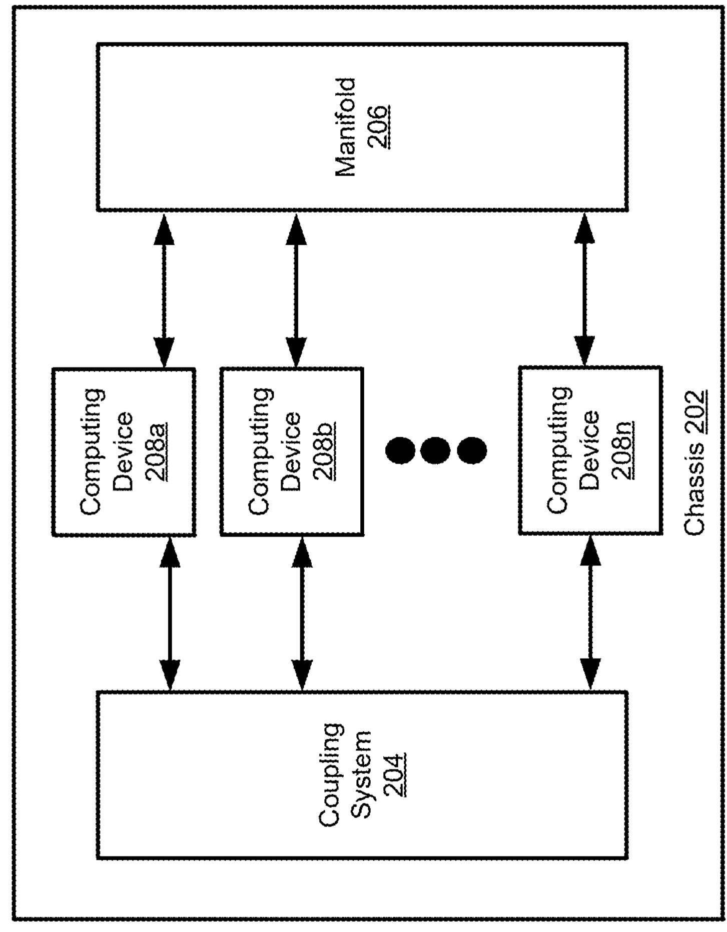

Turning to FIG. 2, FIG. 2 illustrates an environment 200 including chassis 202. The chassis 202 can include a coupling system 204, a manifold 206, and computing devices 208*a*, 208*b*, . . . 208*n* (collectively referred to as computing devices 208). In some examples, the computing devices 208 are similar to, or includes, the information handling system 100 of FIG. 1.

The computing devices 208 can be in communication with the manifold 206. The coupling system 204 can be removably coupled to the computing devices 208.

In short, the coupling system 204 can be removable and can be implemented such that once the computing devices 208 are properly positioned, the coupling system 204 can engage the computing devices 208 to secure the computing devices 208 within the chassis 202. The coupling system 204 is removable, and can be detached from the chassis 202 when needed. This feature is particularly useful during maintenance or upgrades, as it allows technicians to easily access the computing devices 208 without any obstructions. Once the computing devices 208 are correctly positioned within the chassis 202, the coupling system 204 can be engaged. This engagement process involves the coupling system 204 securing the computing devices 208 in place, ensuring they are firmly held within the chassis 202. This secure positioning is crucial for the stability and proper functioning of the computing devices 208, as it prevents any movement or dislodging that could occur during operation. The design of the coupling system 204 allows it to be implemented in a way that it can be easily engaged and disengaged. This flexibility makes it an efficient solution for securing computing devices 208, as it combines ease of use with reliable performance. The detailed mechanisms and methods of how the coupling system 204 achieves this secure engagement are described further in the document.

Figure 3:
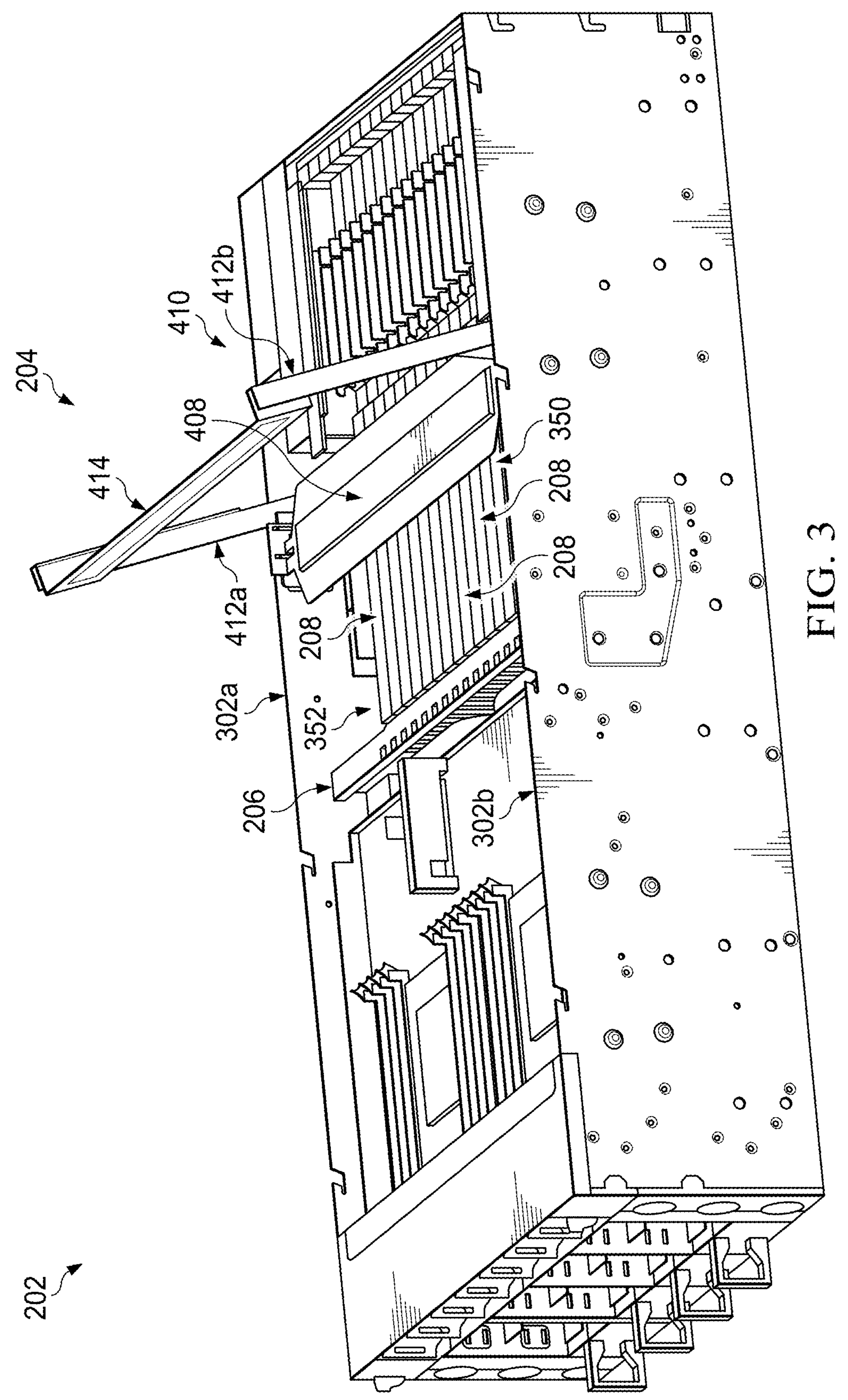
FIG. 3 illustrates a perspective view of the chassis including a coupling system, in a first state.

FIG. 3 illustrates a perspective view of the chassis 202. The chassis 202 includes the coupling system 204, the manifold 206, and coupling devices 208. The chassis 202 can include a first side 302*a* and a second side 302*b* (collectively referred to as sides 302) positioned opposite to the first side 302*a*. The chassis 202 includes the computing devices 208 positioned between the first side 302*a* and the second side 302*b* of the chassis. In some examples, the computing devices 208 can include graphical processing units (GPUs).

Figure 11A:
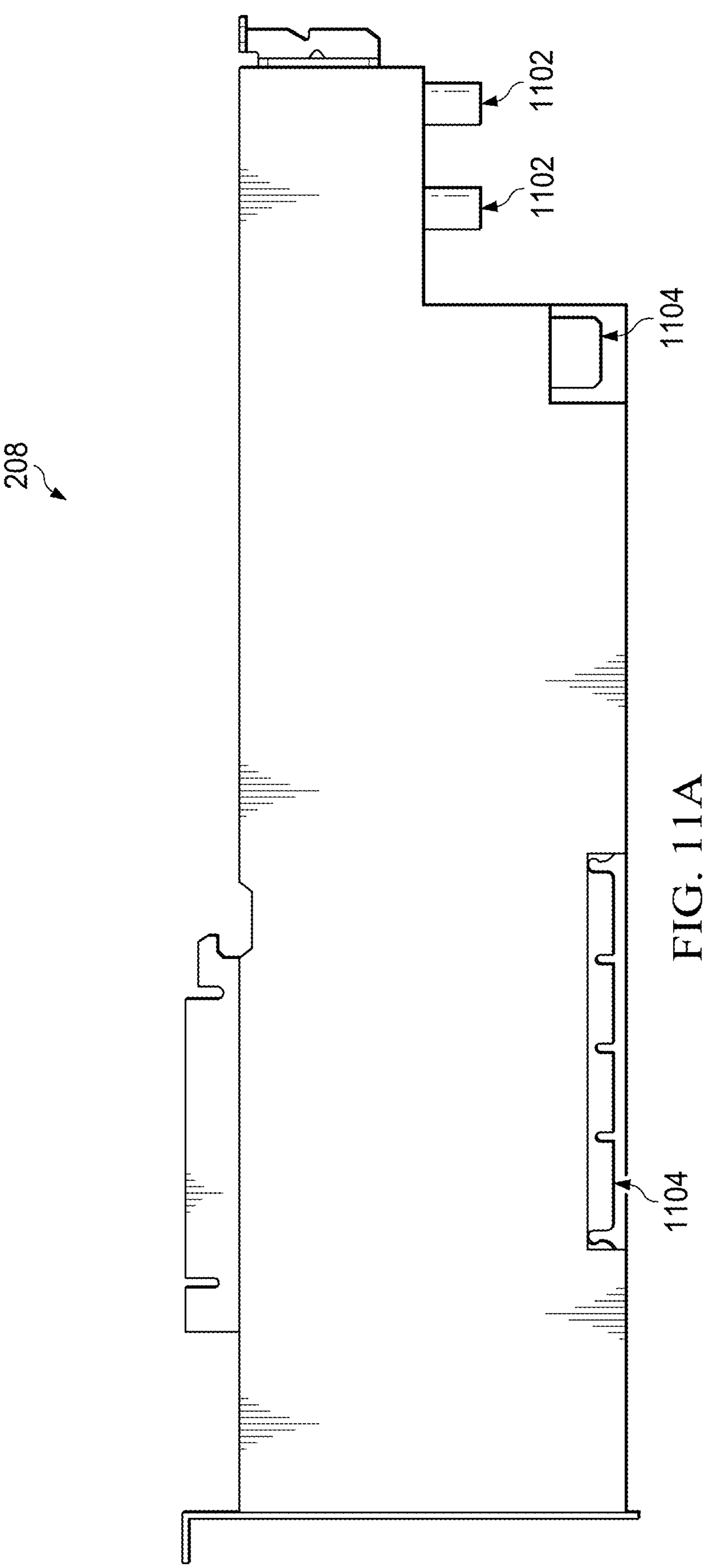
FIG. 11A illustrates a side view of a computing device.
Figure 11B:
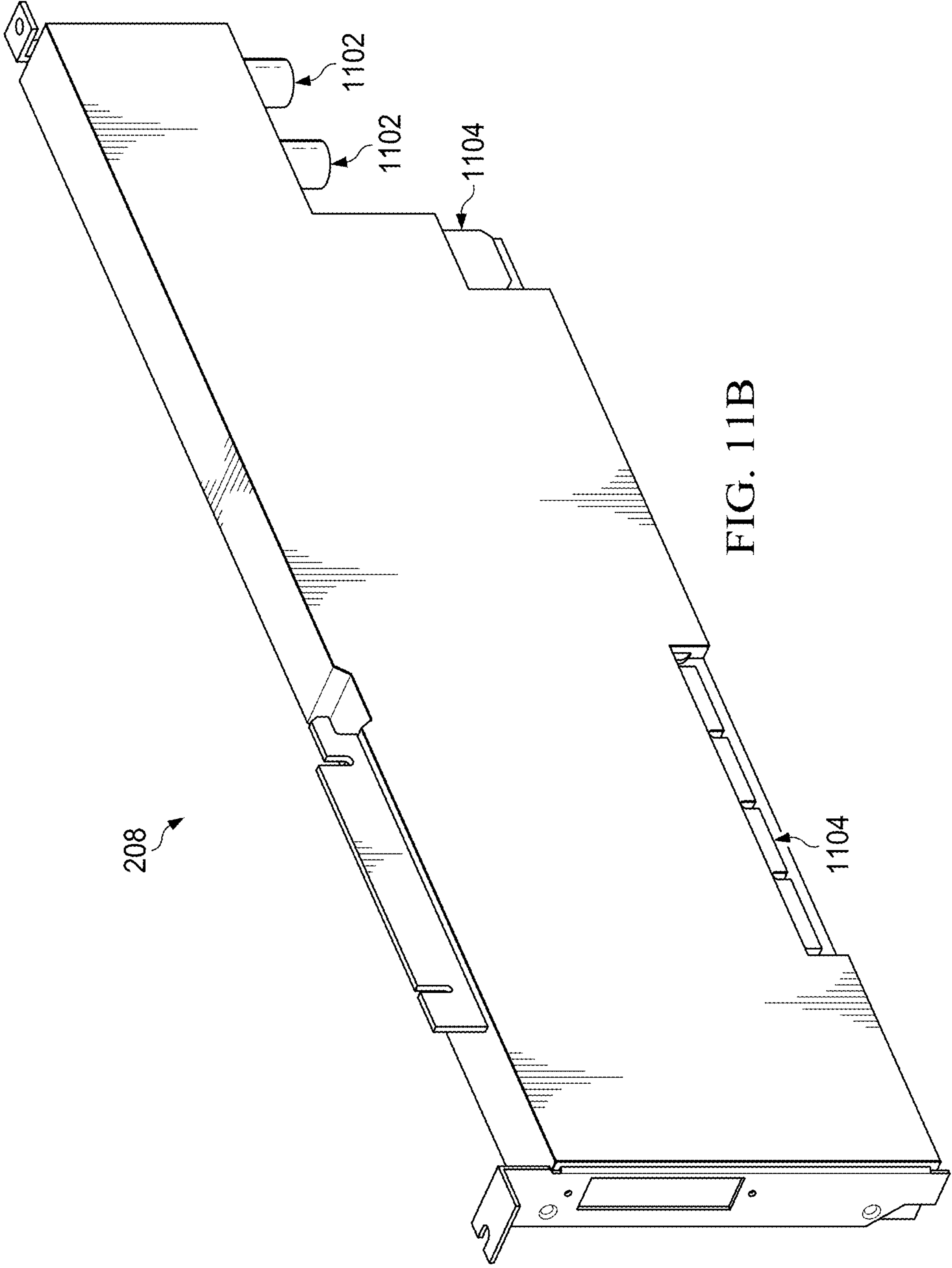
FIG. 11B illustrates a perspective view of the computing device.

FIG. 11A illustrates a side view of the computing device 208; and FIG. 11B illustrates a perspective view of the computing device 208. Referring to FIGS. 11A, 11B, the computing device 208 can include liquid ports 1102 and card edge connectors 1104. The computing device 208 can include any number of liquid ports 1102 and any number of card edge connectors 1104, depending on the application desired.

Figure 4A:
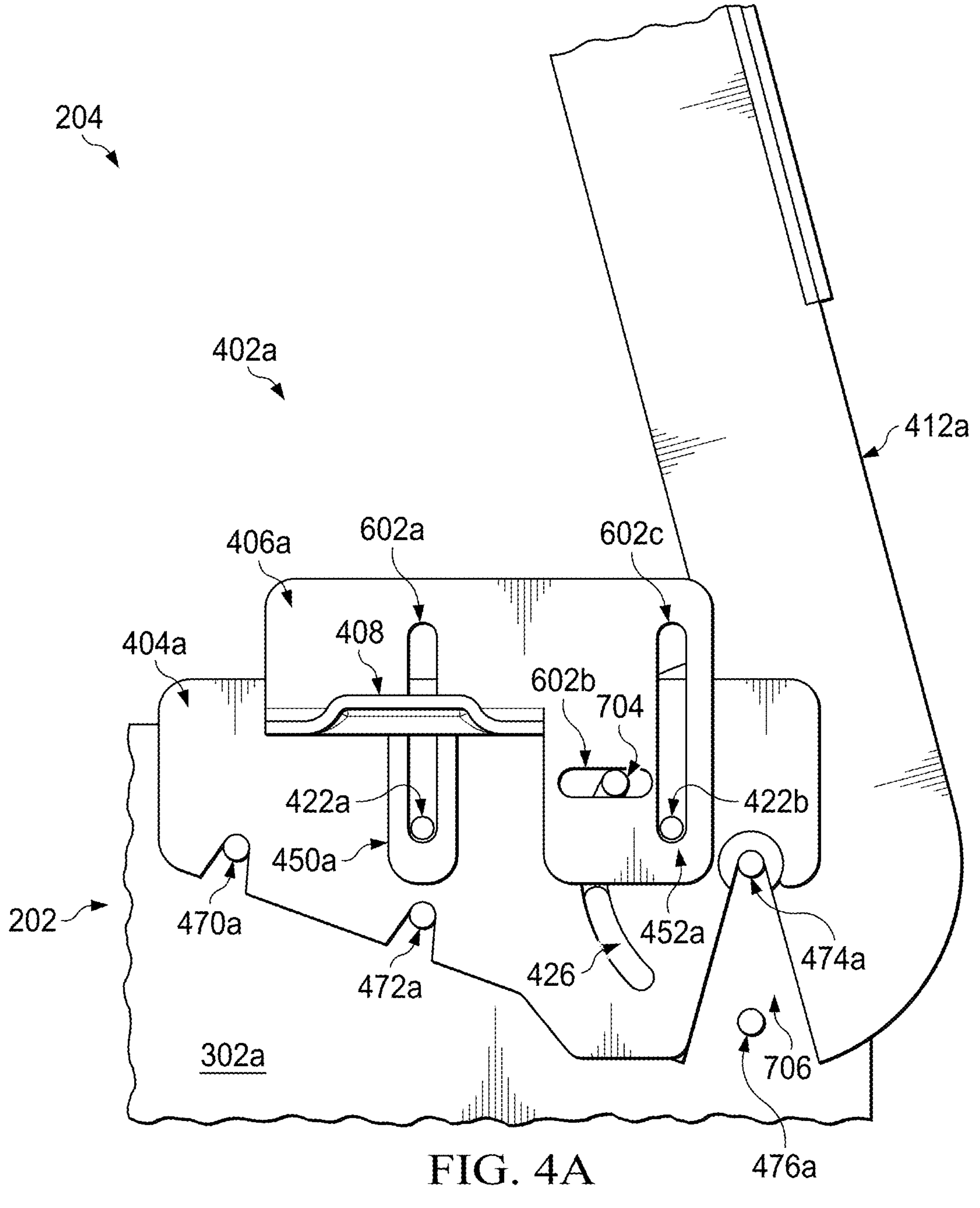
FIGS. 4A, 4B illustrate a side view of the coupling system, in the first state.
Figure 4B:
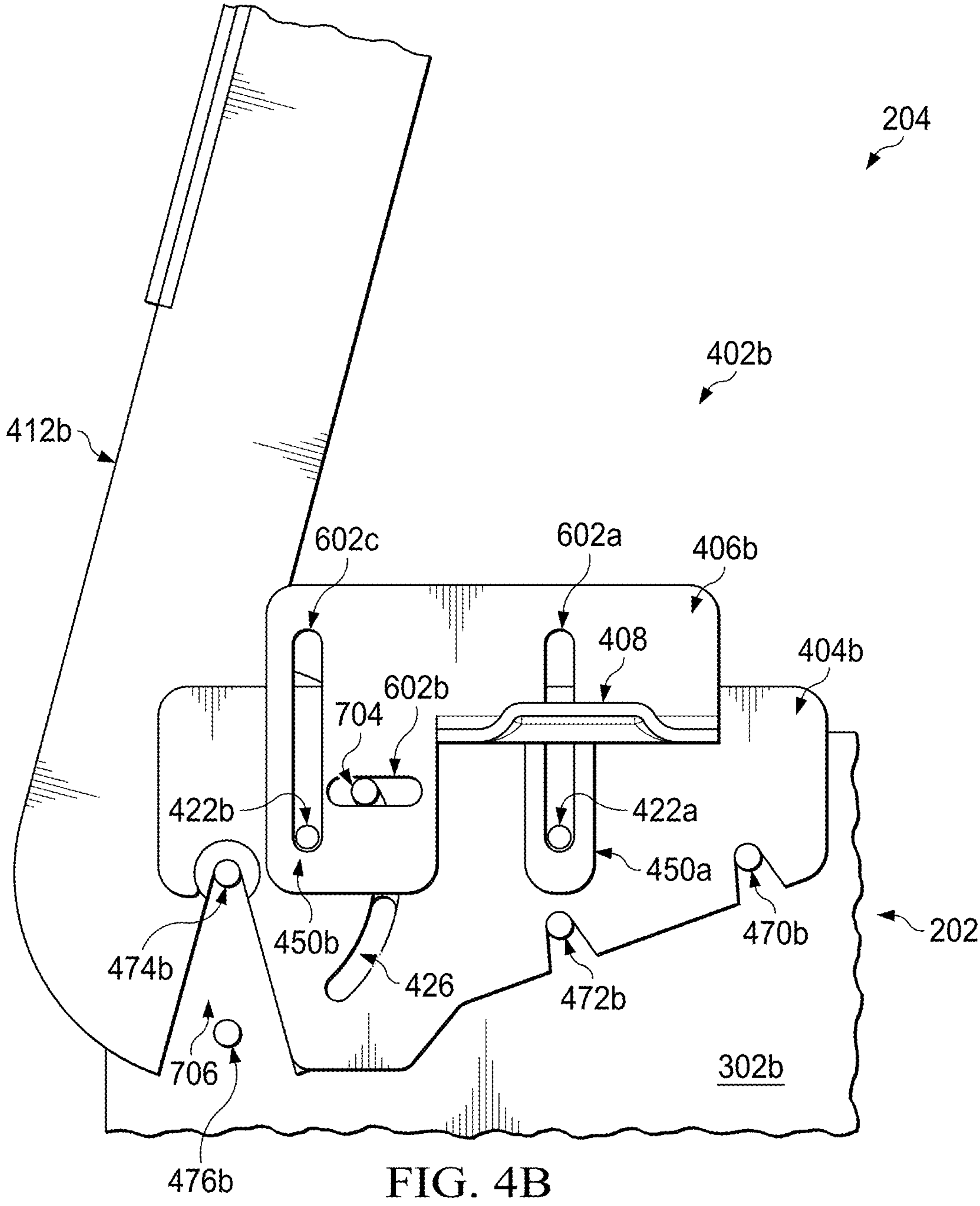

FIG. 4A illustrates a perspective view of a portion of the coupling system 204 that is coupled to the first side 302*a* of the chassis 202; and FIG. 4B illustrates a perspective view of a portion of the coupling system 204 that is coupled to the second side 302*b* of the chassis 202. Referring to FIG. 4A, the coupling system 204 can include a first coupling apparatus 402*a* at the first side 302*a* of the chassis. The first coupling apparatus 402*a* can include a first movement conversion plate 404*a*, a second bar plate 406*a*, and a coupling bar 408. The coupling system 402 can further include a lever assembly 410 (shown in FIG. 3) including a first lever arm 412*a* and a lever bar 414 (shown in FIG. 3). The first lever arm 412*a* is positioned at the first side 302*a* of the chassis 202.

Referring to FIG. 4B, the coupling system 204 can include a second coupling apparatus 402*b* at the second side 302*b* of the chassis. The second coupling apparatus 402*b* can include a second movement conversion plate 404*b*, a second bar plate 406*b*, and the coupling bar 408. The coupling system 402 can further include the lever assembly 410 (shown in FIG. 3) including a second lever arm 412*b* and the lever bar 414 (shown in FIG. 3). The second lever arm 412*b* is positioned at the second side 302*b* of the chassis 202.

The first coupling apparatus 402*a* and the second coupling apparatus 402*b* are collectively referred to as coupling apparatus 402. The first movement conversion plate 404*a* and the second movement conversion plate 404*b* are collectively referred to as movement conversion plate 404. The first bar plate 406*a* and the second bar plate 406*b* are collectively referred to as bar plate 406. The first lever arm 412*a* and the second lever arm 412*b* are collectively referred to as lever arm 412.

The first coupling apparatus 402*a* and the second coupling apparatus 402*b* are substantially the same. That is, the first coupling apparatus 402*a* and the second coupling apparatus 402*b* are mirrors of each other. Thus, the first coupling apparatus 402*a* and the second coupling apparatus 402*b* contain the same elements (mirrored), as described herein.

Referring to FIGS. 4A, 4B, the chassis 202 can include chassis pins 470*a*, 472*a*, 474*a*, 476*a* positioned at the first side 302*a* of the chassis 202; and include chassis pins 470*b*, 472*b*, 474*b*, 476*b* positioned at the second side 302*b* of the chassis 202. The chassis pins 470*a*, 470*b* are collectively referred to as chassis pins 470; chassis pins 472*a*, 472*b* are collectively referred to as chassis pins 472; chassis pins 474*a*, 474*b* are collectively referred to as chassis pins 474; and chassis pins 476*a*, 476*b* are collectively referred to as chassis pins 476.

Figure 5:
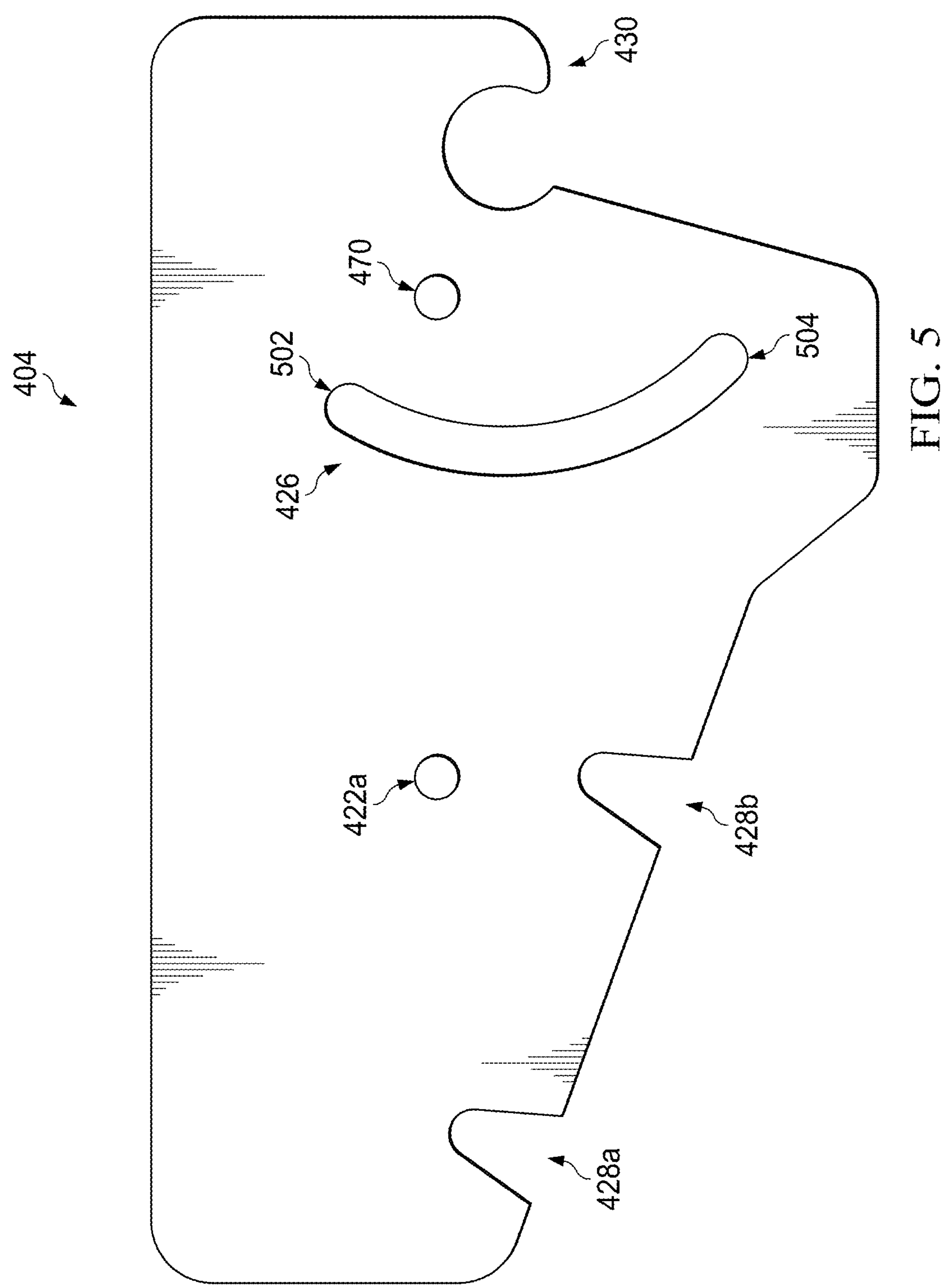
FIG. 5 illustrates a side view of a movement conversion plate of the coupling system.

FIG. 5 illustrates the movement conversion plate 404 (the first movement conversion plate 404*a* or the second movement conversion plate 404*b*). The movement conversion plate 404 can include conversion plate pins 422*a*, 422*b*

(collectively referred to as conversion plate pins 422). The movement conversion plate 404 can further include a conversion plate guide path 426, movement conversion plate slot 428*a*, 428*b* (collectively referred to as movement conversion plate slots 428), and a hooking member 430.

Figure 6:
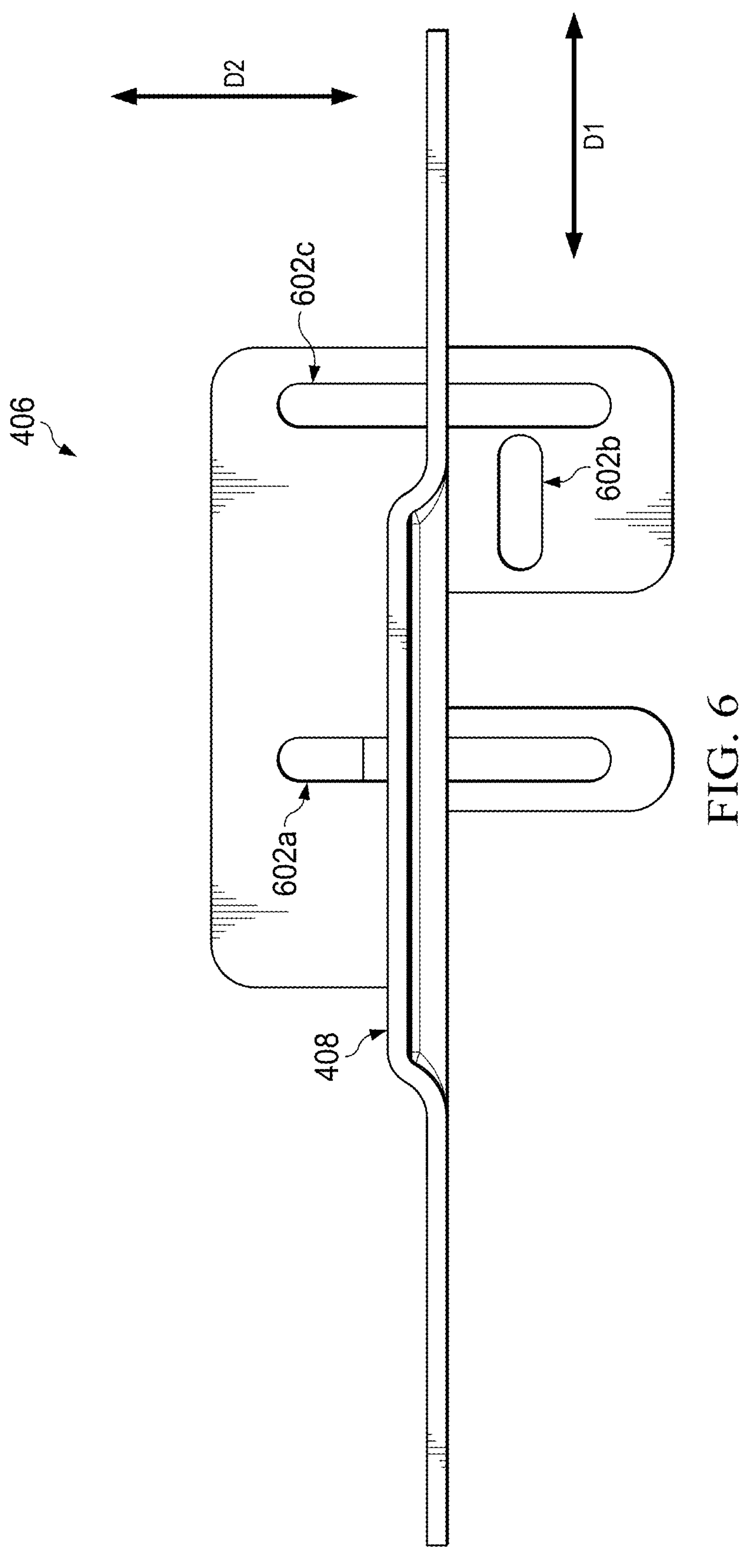
FIG. 6 illustrates a side view of a bar plate of the coupling system.

FIG. 6 illustrates the bar plate 406 (the first bar plate 406*a* or the second bar plate 406*b*). The bar plate 406 includes bar plate guide paths 602*a*, 602*b*, 602*c* (collectively referred to as bar plate guide paths 602). The guide path 602*b* can extend in a first direction D1, and the guide paths 602*a*, 602*c* extends in a second direction D2 orthogonal to the first direction. The coupling bar 408 can extend between the first bar plate 406*a* and the second bar plate 406*b* and be coupled to the first bar plate 406*a* and the second bar plate 406*b*.

Figure 7:
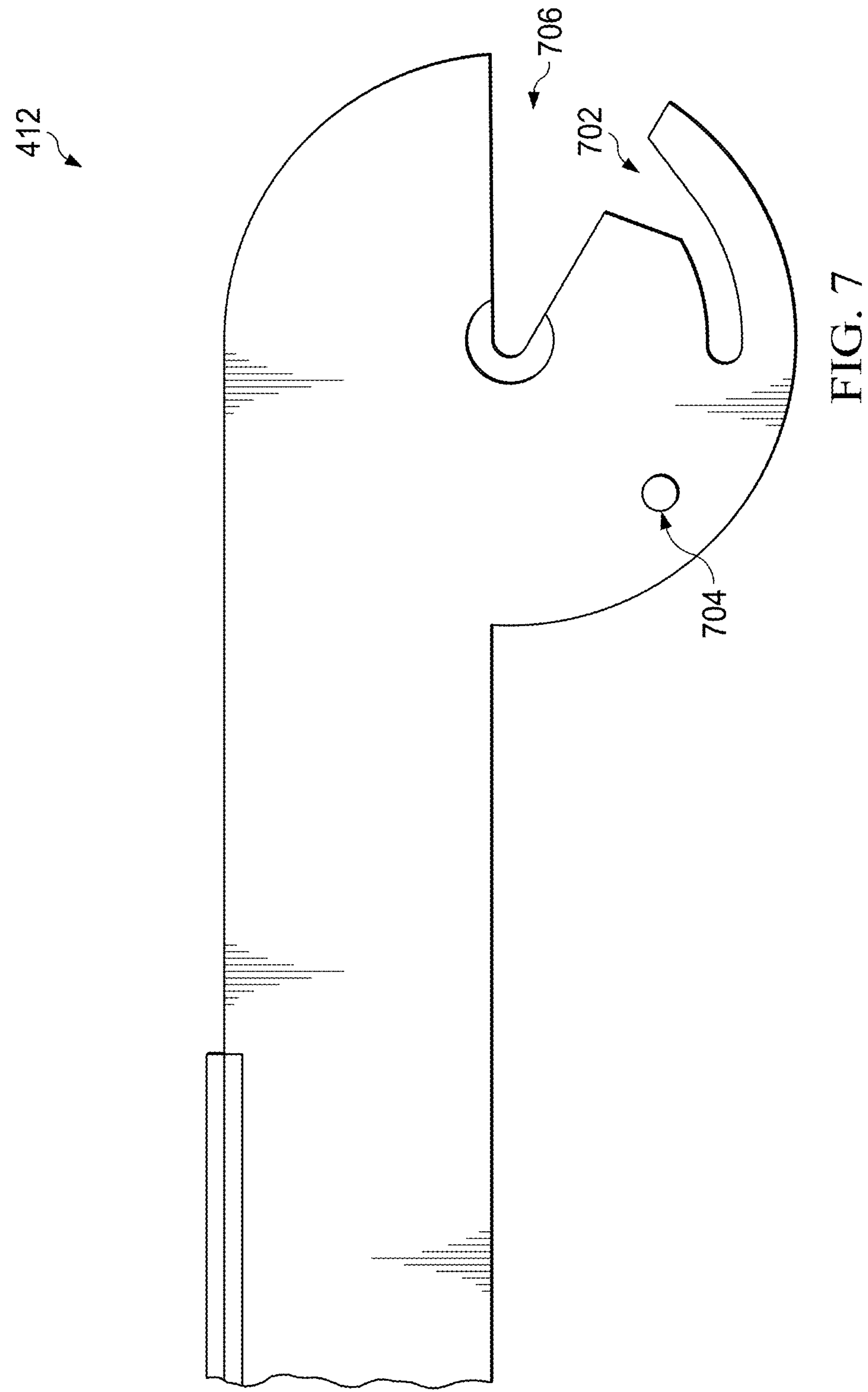
FIG. 7 illustrates a side view of a lever arm of the coupling system.

FIG. 7 illustrates the lever arm 412 (the first lever arm 412*a* or the second lever arm 412*b*). The lever arm 412 can include a lever arm guide path 702, a lever arm guide pin 704, and a lever arm slot 706. The lever bar 414 can extend between the first lever arm 412*a* and the second lever arm 412*b* and be coupled to the first lever arm 412*a* and the second lever arm 412*b*.

To that end, the coupling system 204 is removably coupled to the chassis 202, as shown in FIG. 3. In other words, the coupling system 204 is temporarily coupled to the chassis 202. Referring to FIGS. 3-7, chassis pins 470*a*, 472*a* are positioned within movement conversion plate slots 428*a*, 428*b* of the first movement conversion plate 404*a*; and chassis pins 470*b*, 472*b* are positioned within movement conversion plate slots 428*a*, 428*b* of the second movement conversion plate 404*b*, enabling coupling between the coupling system 204 and the chassis 202. Specifically, the chassis pins 470*a*, 472*a* are positioned within movement conversion plate slots 428*a*, 428*b* of the first movement conversion plate 404*a*; and the chassis pins 470*b*, 472*b* are positioned within movement conversion plate slots 428*a*, 428*b* of the second movement conversion plate 404*b* to align the coupling system 204 with the chassis 202 and support the coupling system 204 against rotation.

Furthermore, the movement conversion plate 404 can be coupled to the bar plate 406 (and the bar plate 406 coupled to the movement conversion plate 404). Specifically, the conversion plate pins 422 are positioned within respective bar plate guide paths 602. Specifically, the conversion plate pin 422*a* is positioned within the bar plate guide path 602*a*; and the conversion plate pin 422*b* is positioned within the bar plate guide path 602*c*.

The first lever arm 412*a* is coupled to the first side 302*a* of the chassis 202. Specifically, the chassis pin 474*a* is positioned within the lever arm slot 706 of the first lever arm 412*a*. Similarly, the second lever arm 412*b* is coupled to the second side 302*b* of the chassis 202. Specifically, the chassis pin 474*b* is positioned within the lever arm slot 706 of the second lever arm 412*b*. Moreover, the lever arm 412 is coupled to the movement conversion plate 404 and the bar plate 406. Specifically, the lever arm guide pin 704 is positioned within the conversion plate guide path 426 of the conversion plate 404 and the bar plate guide path 602*b* of the bar plate 406.

To that end, the coupling system 204 can be in a first state, as shown in FIG. 3. When the coupling system 204 is in the first state, the lever assembly 410 is in a first position to define a first position of the bar plates 406*a*, 406*b* such that the computing devices 208 are in a first position and uncoupled from the manifold 206. Specifically, the coupling bar 408 is in contact with the computing devices 208 at a first end 350 of the computing devices 208. When the coupling system 204 is in the first state, the computing devices 208 are uncoupled from the manifold 206. Furthermore, when the coupling system 204 is in the first state, the conversion plate pins 422 are positioned at first ends of respective bar plate guide paths 602. Specifically, the conversion plate pin 422*a* is at a first end 450*a* of the bar plate guide path 602*a*; and the conversion plate pin 422*b* is at a first end 452*a* of the bar plate guide path 602*c*. Moreover, when the coupling system 204 is in the first state, the lever arm guide pin 704 is at a first end 502 (shown in FIG. 5) of the conversion plate guide path 426.

Figure 8:
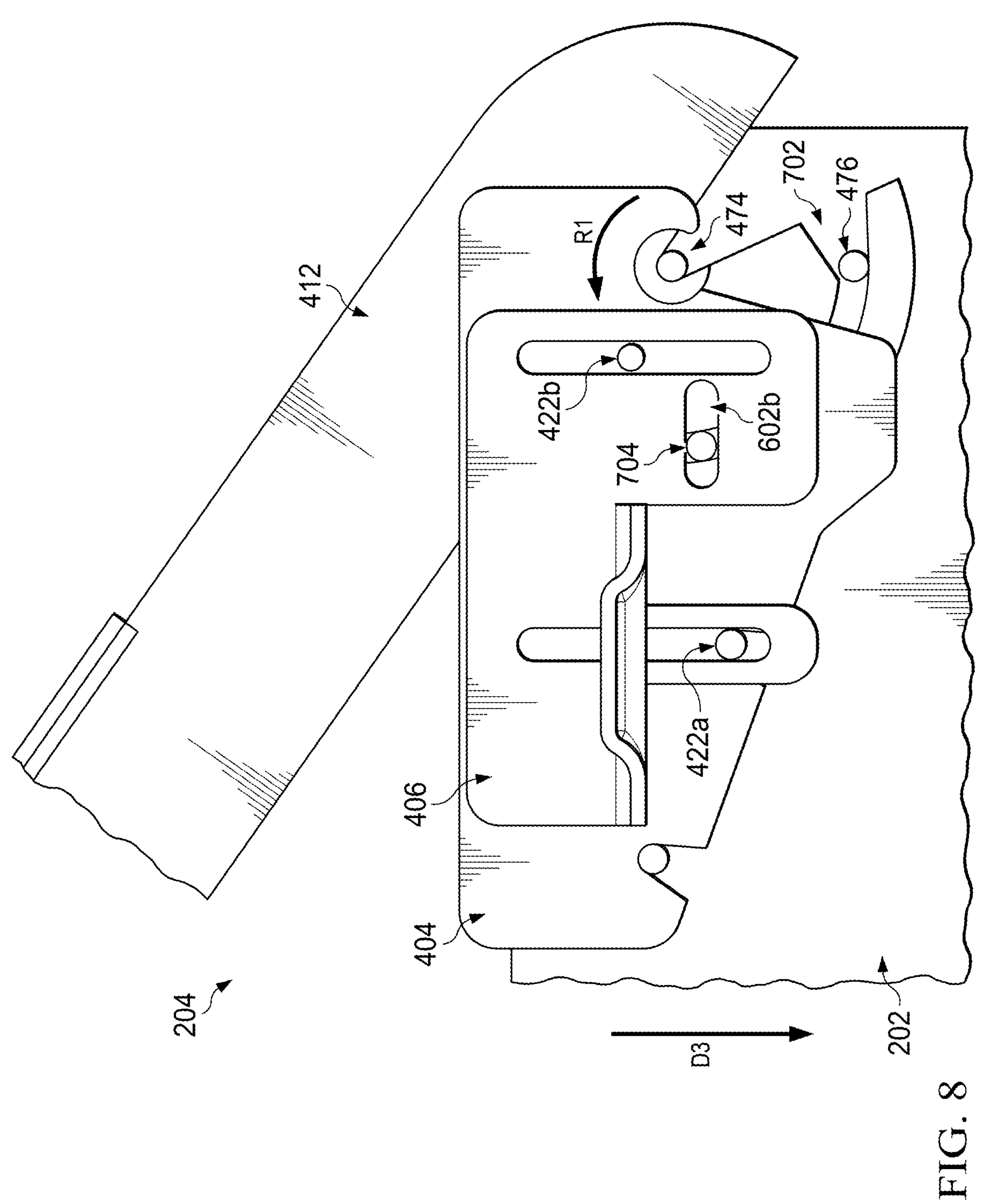
FIG. 8 illustrates a side view of the coupling system, in a transition state.

FIG. 8 illustrates the coupling system 204 in a transition state. Specifically, the lever arm 412 is rotated about the chassis pin 470 about the direction R1. Referring to FIGS. 4-8, in response to the rotation, the movement conversion plate 404 converts the rotational motion of the lever arm 412 to translational movement of the bar plate 406. Specifically, the movement conversion plate 404 converts the rotation motion of the lever arm 412 to translational movement of the bar plate 406 via the lever arm guide pin 704 being positioned within the conversion plate guide path 426 and the bar plate guide path 602*b*. Specifically, as the lever arm 412 rotates in the direction R1, the lever arm guide pin 704 travels the path of the conversion plate guide path 426. Further, as the lever arm guide pin 704 is additionally positioned within the bar plate guide path 602*b*, with the bar plate guide path 602*b* extending in the direction D1 (as shown in FIG. 6), the bar plate 404 translates in the direction D3. Specifically, lever arm guide pin 704 travels the path of the conversion plate guide path 426, and in doing such, further translates the lever arm guide pin 704 within the bar plate guide path 602*b*. As the lever arm guide pin 704 is confined to movement within the bar plate guide path 602*b* only along the direction D1 (shown in FIG. 6), the lever arm guide pin 704 exerts a force on the bar plate 406 in the direction D3 (at the bar plate guide path 602*b*) to translate the bar plate in the direction D3. In other words, the combination of the lever arm guide pin 704 being positioned within the conversion plate guide path 426 and the bar plate guide path 602*b*, rotational movement of the lever arm 412 about the direction R1 facilitates translation of such rotational movement to translational movement of the bar plate 406 in the direction D3.

Referring to FIG. 8, moreover, as the lever arm 412 is rotated about the chassis pin 474 about the direction R1, the chassis pin 476 becomes positioned within the lever arm guide path 702.

Figure 9:
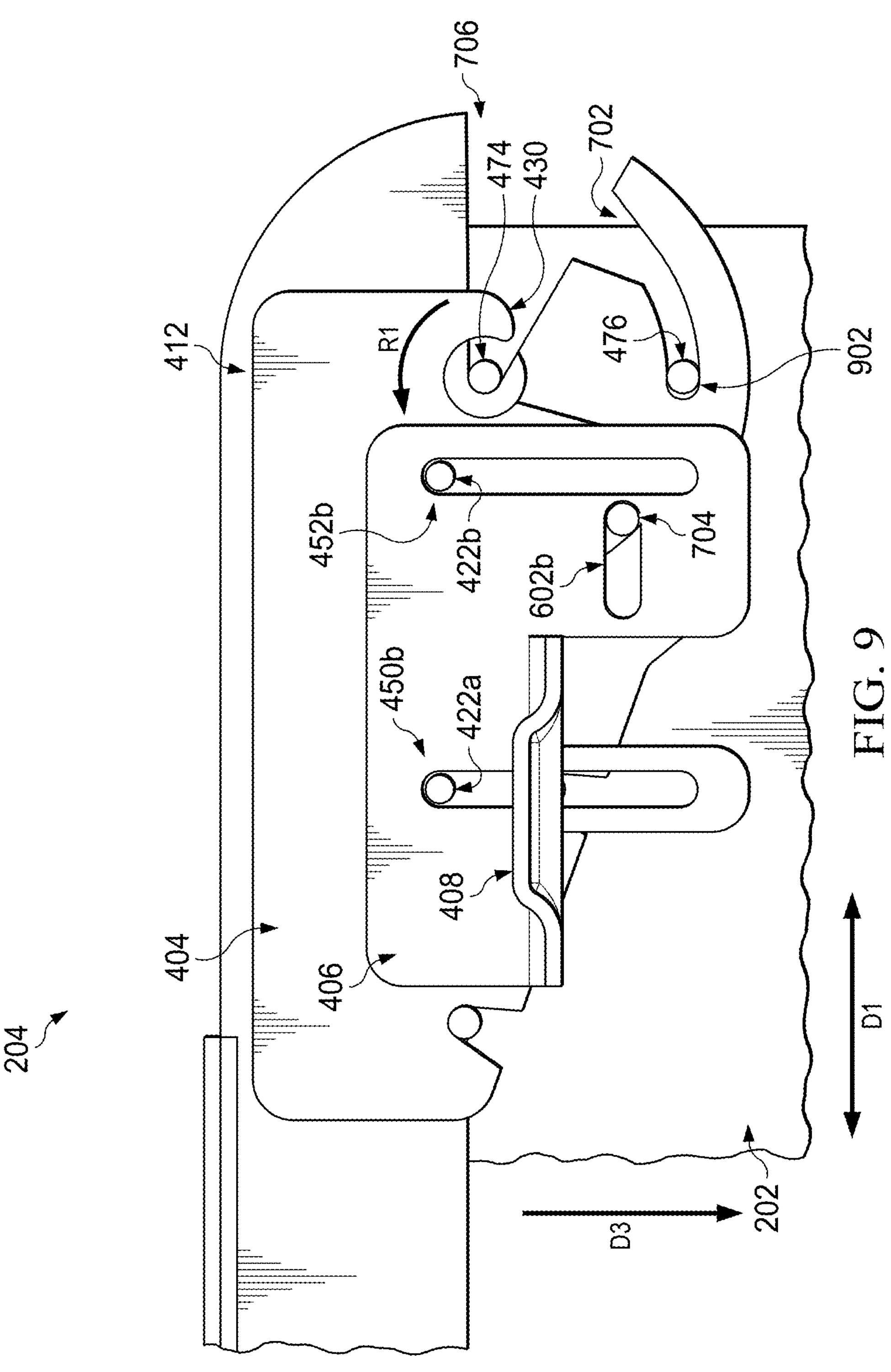
FIG. 9 illustrates a side view of the coupling system, in a second state.

FIG. 9 illustrates the coupling system 204 in a second state. Specifically, lever arm 412 is rotated about the chassis pin 474 about the direction R1 from the transition state until the coupling system 204 is in the second state. In some examples, the lever arm 412 is rotated until the lever arm 412 is substantially parallel with the lever bar 408 (e.g., 0 degree angle with respect to the lever bar 408). In some examples, the lever arm 412 is rotated about the chassis pin 474 until the lever arm guide pin 704 is at a second end 504 (shown in FIG. 5) of the conversion plate guide path 426.

Specifically, the movement conversion plate 404 converts the rotational motion of the lever arm 412 to translational movement of the bar plate 406 via the lever arm guide pin 704 being positioned within the conversion plate guide path 426 and the bar plate guide path 602*b*. Specifically, as the lever arm 412 rotates in the direction R1, the lever arm guide pin 704 travels the path of the conversion plate guide path 426. Further, as the lever arm guide pin 704 is additionally positioned within the bar plate guide path 602*b*, with the bar plate guide path 602*b* extending in the direction D1 (as shown in FIG. 6), the bar plate 404 further translates in the direction D3. Specifically, lever arm guide pin 704 travels the path of the conversion plate guide path 426, and in doing such, further translates the lever arm guide pin 704 within the bar plate guide path 602*b*. As the lever arm guide pin 704 is confined to movement within the bar plate guide path 602*b* only along the direction D1 (shown in FIG. 6), the lever arm guide pin 704 exerts a force on the bar plate 406 in the direction D3 (at the bar plate guide path 602*b*) to further translate the bar plate in the direction D3. In other words, the combination of the lever arm guide pin 704 being positioned within the conversion plate guide path 426 and the bar plate guide path 602*b*, rotational movement of the lever arm 412 about the direction R1 facilitates translation of such further rotational movement to further translational movement of the bar plate 406 in the direction D3.

Figure 10:
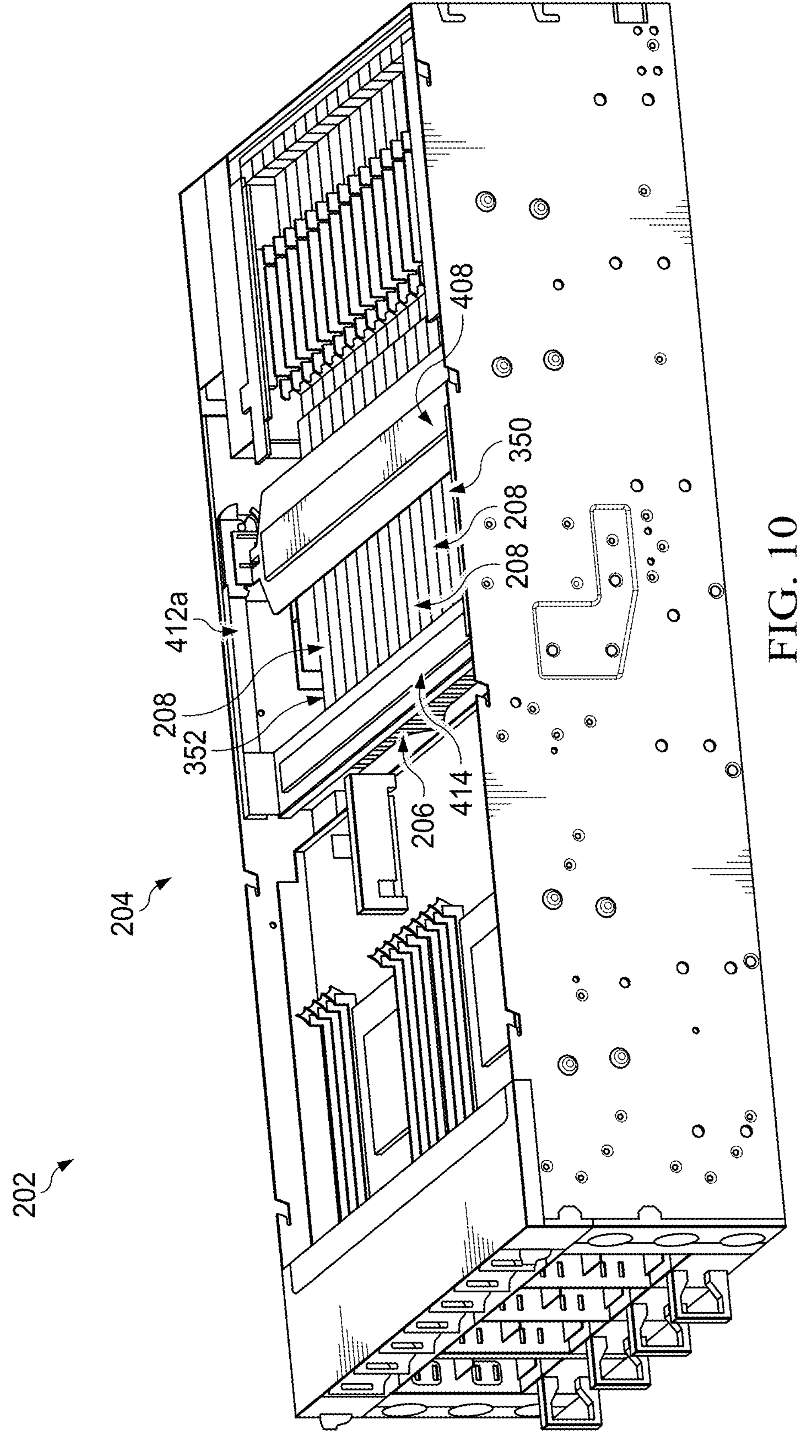
FIG. 10 illustrates a perspective view of the chassis including the coupling system, in the second state.

Moreover, when the coupling system 204 is in the second state, the lever assembly 410 is in a second position to define a second position of the bar plates 406*a*, 406*b* such that the computing devices 208 are in a second position and coupled from the manifold 206, as shown in FIG. 10. Specifically, the coupling bar 408 is in contact with the computing devices 208 at a second end 352 of the computing devices 208. When the coupling system 204 is in the second state, the computing devices 208 are coupled with the manifold 206. Furthermore, when the coupling system 204 is in the first state, the conversion plate pins 422 are positioned at second ends of respective bar plate guide paths 602. Specifically, the conversion plate pin 422*a* is at a second end 450*b* of the bar plate guide path 602*a* (the second end 450*b* opposite to the first end 450*a*); and the conversion plate pin 422*b* is at a second end 452*b* of the bar plate guide path 602*c* (second end 452*b* opposite to the first end 452*a*). Moreover, when the coupling system 204 is in the second state, the lever arm guide pin 704 is at the second end 504 (shown in FIG. 5) of the conversion plate guide path 426 (the second end 504 opposite to the first end 502).

Figure 12:
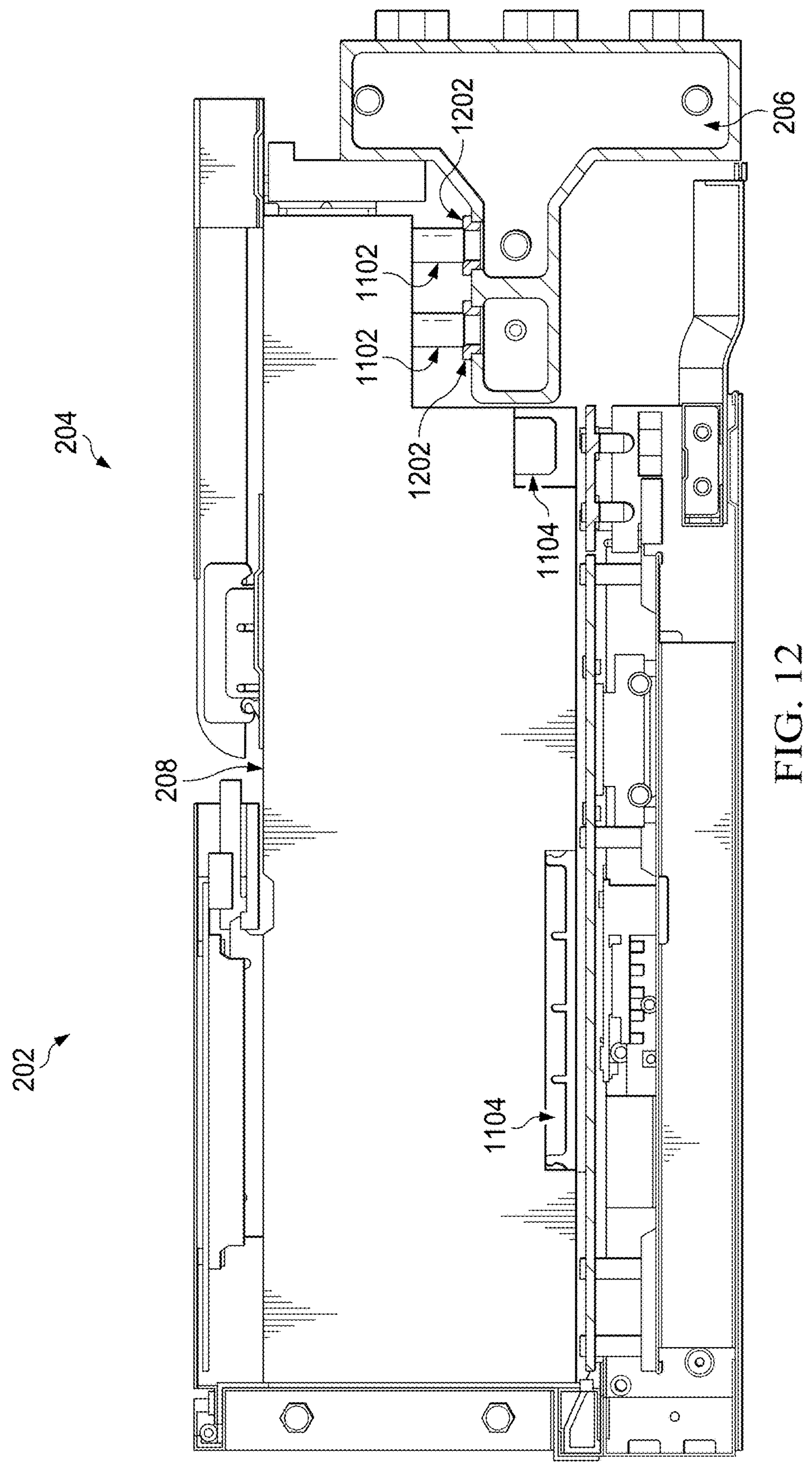
FIG. 12 illustrates a side view of the coupling system, in the second state.

FIG. 12 illustrates a side view of the coupling system 204 in the second state. That is, when the coupling system 204 is in the second state, the liquid ports 1102 of the computing devices 208 are engaged with corresponding sockets 1202 of the manifold 206. Thus, when the coupling system 204 is in the second state, the computing devices 208 are coupled to the manifold 206 such that the computing devices 208 are in liquid communication with the manifold 206 through the engagement of the liquid ports 1102 of the computing devices 208 and the corresponding sockets 1202 of the manifold 206. Moreover, when the coupling system 204 is in the second state, the card edge connectors 1104 of the computing devices 208 are engaged with corresponding board connectors (not shown) of the chassis 202.

Referring to FIG. 9, in some examples, when the coupling system 204 is in the second state, the hooking member 430 is in superimposition with the lever arm slot 706. Thus, movement of the coupling system 204 along the direction D1 is minimized, if not prevented. That is, the combination of the hooking member 430 and the lever arm 412 substantially surround the chassis pin 474 such that movement of the coupling system 204 is minimized, if not prevented.

Furthermore, when the coupling system 204 is in the second state, the chassis pin 474 is positioned at a first end 902 of the lever arm guide path 702. Thus, further rotation of the lever assembly 410 in the direction R1 is prevented.

In some further examples, the chassis 202 can include an additional pin (not shown) to retain the lever assembly 410 in the second position.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. A chassis, including:

a manifold;

one or more computing devices positioned between a first side and a second side of the chassis, the second side opposite to the first side;

a coupling system, including:

a first coupling apparatus positioned at the first side of the chassis, including:

a first movement conversion plate including first conversion plate pins and a first conversion plate guide path;

a first bar plate including first bar plate guide paths, wherein the first conversion plate pins are positioned within respective first bar plate guide paths; and a coupling bar coupled to the first bar plate and in contact with the one or more computing devices;

a lever assembly including:

a first lever arm positioned at the first side of the chassis, including a first lever arm guide path, and a first lever arm guide pin positioned within the first conversion plate guide path; and a lever bar coupled to the first lever arm, wherein when the coupling system is in a first state:

the lever assembly is in a first position to define a first position of the first bar plate such that the one or more computing devices are in a first position and uncoupled from the manifold, wherein the first conversion plate pins are positioned at a first end of respective first bar plate guide paths and the first lever arm guide pin is positioned at a first end of the first conversion plate guide path, wherein when the coupling system is in a second state:

the lever assembly is in a second position to define a second position of the first bar plate such that the one or more computing devices are in a second position and coupled with the manifold, wherein the first conversion plate pins are positioned at a second end of respective first bar plate guide paths opposite to the first end and the first lever arm guide pin is positioned at a second end of the first conversion plate guide path opposite to the first end.

2. The chassis of claim 1, wherein the coupling system is removable coupled to the chassis.

3. The chassis of claim 1, the first movement conversion plate further includes a plurality of first movement conversion plate slots, wherein the chassis includes a plurality of chassis pins positioned at the first side, wherein a subset of the plurality of chassis pins are positioned within respective first movement conversion plate slots.

4. The chassis of claim 1, the first lever arm further including a first lever arm slot, wherein the chassis includes a plurality of chassis pins positioned at the first side, wherein a first chassis pin of the plurality of chassis pins are positioned within the first lever arm slot.

5. The chassis of claim 4, the first movement conversion plate further including a first hooking element, wherein when the coupling system is in the second state, the first hooking member is in superimposition with the first lever arm slot.

6. The chassis of claim 1, wherein the chassis includes a plurality of chassis pins positioned at the first side, wherein when the coupling system is in the second state, a second chassis pin of the plurality of chassis pins is positioned at a first end of the first lever arm guide path.

7. The chassis of claim 1, wherein the first lever arm guide pin is further positioned within a particular first bar plate guide path of the first bar plate guide paths.

8. The chassis of claim 7, wherein the particular first bar plate guide path extends in a first direction, wherein the first conversion plate pins are positioned within respective first bar plate guide paths that extend in a second direction orthogonal to the first direction.

9. The chassis of claim 1, wherein the computing devices are graphical processing units (GPUs).

10. The chassis of claim 1, wherein the coupling bar contacts the one or more computing devices at a first end of the computing devices opposite to a second end of the computing devices that are coupled to the manifold when the coupling system is in the second state.

11. The chassis of claim 1, the coupling system further including:

a second coupling apparatus positioned at the second side of the chassis, including:

a second movement conversion plate including second conversion plate pins and a second conversion plate guide path; and a second bar plate including second bar plate guide paths, wherein the second conversion plate pins are positioned within respective second bar plate guide paths, wherein the coupling bar is coupled to the second bar plate.

12. The chassis of claim 11, the lever assembly further including:

a second lever arm positioned at the second side of the chassis, including a second lever arm guide path, and a second lever arm guide pin positioned within the second conversion plate guide path, wherein the lever bar is coupled to the second lever arm.

13. The chassis of claim 12, wherein when the coupling system is in the first state:

the lever assembly is in the first position to define the first position of the first bar plate such that the one or more computing devices are in the first position and uncoupled from the manifold, wherein the second conversion plate pins are positioned at a first end of respective second bar plate guide paths and the second lever arm guide pin is positioned at a first end of the second conversion plate guide path.

14. The chassis of claim 13, wherein when the coupling system is in the second state:

the lever assembly is in the second position to define the second position of the second bar plate such that the one or more computing devices are in the second position and coupled with the manifold, wherein the second conversion plate pins are positioned at a second end of respective second bar plate guide paths opposite to the first end and the second lever arm guide pin is positioned at a second end of the second conversion plate guide path opposite to the first end.

15. A chassis, including:

a manifold;

one or more computing devices positioned between a first side and a second side of a chassis, the second side opposite to the first side;

a coupling system, including:

a first coupling apparatus positioned at the first side of the chassis, including:

a first movement conversion plate including first conversion plate pins and a first conversion plate guide path;

a first bar plate including first bar plate guide paths, wherein the first conversion plate pins are positioned within respective first bar plate guide paths; and a second coupling apparatus positioned at the second side of the chassis, including:

a second movement conversion plate including second conversion plate pins and a second conversion plate guide path;

a second bar plate including second bar plate guide paths, wherein the second conversion plate pins are positioned within respective second bar plate guide paths; and a coupling bar coupled to the first bar plate and the second bar plate and in contact with the one or more computing devices;

a lever assembly including:

a first lever arm positioned at the first side of the chassis, including a first lever arm guide path, and a first lever arm guide pin positioned within the first conversion plate guide path;

a second lever arm positioned at the second side of the chassis, including a second lever arm guide path, and a second lever arm guide pin positioned within the second conversion plate guide path; and a lever bar coupled to the first lever arm and the second lever arm, wherein when the coupling system is in a first state:

the lever assembly is in a first position to define a first position of the first bar plate such that the one or more computing devices are in a first position and uncoupled from the manifold, wherein the first conversion plate pins are positioned at a first end of respective first bar plate guide paths, the second conversion plate pins are positioned at a first end of respective second bar plate guide paths, the first lever arm guide pin is positioned at a first end of the first conversion plate guide path, and the second lever arm guide pin is positioned at a first end of the second conversion plate guide path, wherein when the coupling system is in a second state:

the lever assembly is in a second position to define a second position of the second bar plate such that the one or more computing devices are in a second position and coupled with the manifold, wherein the first conversion plate pins are positioned at a second end of respective first bar plate guide paths opposite to the first end, the second conversion plate pins are positioned at a second end of respective second bar plate guide paths opposite to the first end, the first lever arm guide pin is positioned at a second end of the first conversion plate guide path opposite to the first end, and the second lever arm guide pin is positioned at a second end of the second conversion plate guide path opposite to the first end.

16. The information handling system of claim 15, wherein the coupling system is removable coupled to the chassis.

17. The information handling system of claim 15, wherein the computing devices are graphical processing units (GPUs).

18. The information handling system of claim 15, wherein the coupling bar contacts the one or more computing devices at a first end of the computing devices opposite to a second end of the computing devices that are coupled to the manifold when the coupling system is in the second state.

* * * * *